United States Patent
Schoenknecht

(10) Patent No.: US 9,548,675 B2
(45) Date of Patent: Jan. 17, 2017

(54) METHOD AND DEVICE FOR DISCHARGING AN INVERTER CAPACITOR

(75) Inventor: Andreas Schoenknecht, Renningen (DE)

(73) Assignee: Robert Bosch GmbH, Stuttgart (DE)

( * ) Notice: Subject to any disclaimer, the term of this patent is extended or adjusted under 35 U.S.C. 154(b) by 316 days.

(21) Appl. No.: 14/349,205

(22) PCT Filed: Aug. 10, 2012

(86) PCT No.: PCT/EP2012/065694
§ 371 (c)(1),
(2), (4) Date: Apr. 2, 2014

(87) PCT Pub. No.: WO2013/050196
PCT Pub. Date: Apr. 11, 2013

(65) Prior Publication Data
US 2014/0247000 A1    Sep. 4, 2014

(30) Foreign Application Priority Data
Oct. 4, 2011   (DE) .......................... 10 2011 083 945

(51) Int. Cl.
*H02P 6/14*   (2016.01)
*H02M 7/5387*   (2007.01)
(Continued)

(52) U.S. Cl.
CPC ........... *H02M 7/53871* (2013.01); *H02M 1/08* (2013.01); *H02M 1/36* (2013.01);
(Continued)

(58) Field of Classification Search
USPC .............. 318/400.27, 400.26, 400.3, 400.17, 318/400.21, 400.22, 400.31, 687, 135, 678, 679,318/691; 363/41, 65, 98
See application file for complete search history.

(56) References Cited

U.S. PATENT DOCUMENTS 5,204,594 A * 4/1993 Carobolante ........... G05F 1/575
  318/400.04
2005/0169018 A1   8/2005 Hatai et al.
(Continued)

FOREIGN PATENT DOCUMENTS

CN   101534069   9/2009
CN   101960707   1/2011
(Continued)

OTHER PUBLICATIONS

International Search Report for Application No. PCT/EP2012/065694 dated Nov. 19, 2012 (English Translation, 3 pages).

*Primary Examiner* — Jorge L Carrasquillo
(74) *Attorney, Agent, or Firm* — Michael Best & Friedrich LLP

(57) ABSTRACT

The invention relates to a control device for triggering a semi-conductor switch of an inverter, the control device comprising: a switching signal amplification device, which is designed to amplify a switching signal generated by a control regulation of the inverter, and to generate a first switching control signal that triggers the semi-conductor switch in a switching mode; a current regulation device, which is coupled to a current sensor output of the semiconductor switch and is designed to generate a second switching control signal that triggers the semi-conductor switch in a linear mode; and a selection device, which is coupled to the switching signal amplification device and the current regulation device and is designed to output, on the basis of at least one mode selection signal, either the first switching control signal or the second switching control signal in order to trigger a control terminal of the semi-conductor switch.

9 Claims, 2 Drawing Sheets

(51) Int. Cl.
  *H02M 1/08*    (2006.01)
  *H02M 1/36*    (2007.01)
  *H03K 17/082*  (2006.01)
  *H02M 1/00*    (2006.01)
  *H02M 1/32*    (2007.01)

(52) U.S. Cl.
  CPC ........... H02P 6/14 (2013.01); H03K 17/0822 (2013.01); *H02M 2001/0045* (2013.01); *H02M 2001/322* (2013.01)

(56) References Cited

U.S. PATENT DOCUMENTS

2005/0231171 A1  10/2005  Kato et al.
2010/0007295 A1* 1/2010  Yang ................. H02P 6/085
                                               318/400.22
2011/0080149 A1* 4/2011  Fukuta ................ H02M 1/36
                                               323/284
2011/0133546 A1* 6/2011  Jang ................. H02M 7/53871
                                               307/9.1
2011/0221374 A1* 9/2011  Maebara ........... H02M 7/53871
                                               318/494
2011/0234176 A1* 9/2011  Nakamura .............. H02M 1/08
                                               320/166

FOREIGN PATENT DOCUMENTS

| | | |
|---|---|---|
| DE | 4235138 | 4/1994 |
| JP | 2009017750 | 1/2009 |
| JP | 2011029818 | 2/2011 |
| WO | 2011104848 | 9/2011 |

\* cited by examiner

METHOD AND DEVICE FOR DISCHARGING AN INVERTER CAPACITOR

BACKGROUND OF THE INVENTION

The present invention relates to a control device for semiconductor switches of an inverter and a method for driving an inverter, in particular for operating an inverter in an emergency discharge mode.

Electric and hybrid vehicles often have electronic power switching components in the drive system between the fraction battery and the electric machine, which are generally designed as voltage-source inverters. A DC voltage intermediate circuit acts as a coupling element between the fraction battery and an inverter which can be driven for transmitting electric power from the DC voltage intermediate circuit to the electric machine.

Inverters can, for example, be designed as a full bridge circuit having a number of bridge arms, each having two semiconductor switches. The semiconductor switches of the bridge arms connected to a first output terminal of the DC voltage intermediate circuit can be designated as high-side switches, and the semiconductor switches of the bridge arms connected to the second output terminal of the DC voltage intermediate circuit can be designated as low-side switches. For example, IGBT (insulated-gate bipolar transistor) modules having a diode which is reverse-connected in parallel or MOSFETs (metal-oxide semiconductor field-effect transistors) can be used as semiconductor switches.

To drive the inverter, controls are used which generate switching signals for the semiconductor switches. In the event of a fault, various requirements are placed on the controls for reasons of safety. For example, it may be necessary to short-circuit the motor windings of the electric machine safely in the event of a fault. This can be achieved by closing all high-side switches and opening all low-side switches (or vice-versa), which is also referred to as an "active short circuit."

In addition, in the event of a fault, it is necessary to discharge the DC voltage intermediate circuit rapidly and reliably, in particular, if there is a failure of supply voltages in the control. This can be achieved via an emergency discharge. An emergency discharge of this kind is normatively requested within a maximum emergency discharge time of five seconds in order to be able to ensure the electrical operating safety of the vehicle.

The publication US 2005/0231171 A1 discloses an electrical drive system having an electric motor, a pulse-width-modulation inverter, and an intermediate-circuit capacitor. The intermediate-circuit capacitor can be discharged in a controlled manner via an appropriate switching operation of the pulse-width-modulation inverter.

SUMMARY OF THE INVENTION

According to one aspect, the present invention creates a control device for driving a semiconductor switch of an inverter, having a switching signal amplification means which is designed to amplify a switching signal generated by a control of the inverter and to generate a first switching control signal which drives the semiconductor switch in a switching mode, a current regulation means which is coupled with a current sensor output of the semiconductor switch and which is designed to generate a second switching control signal which drives the semiconductor switch in a linear mode, and a selection means which is coupled with the switching signal amplification means and the current regulation means and which is designed to output either the first switching control signal or the second switching control signal as a function of at least one mode selection signal for driving a control terminal of the semiconductor switch.

According to another aspect, the present invention creates a drive system for an n-phase electric machine, where n≥1, having an intermediate-circuit capacitor which is connected to two input voltage terminals; an inverter having a plurality of semiconductor switches which is coupled with the intermediate-circuit capacitor, is supplied with electric energy from the intermediate-circuit capacitor, and is designed to generate an n-phase supply voltage for the electric machine; a plurality of control devices according to the present invention, each of which is designed to generate a switching control signal for one of the semiconductor switches of the inverter; and a control which is coupled with a plurality of the control devices and which is designed to generate switching signals for the semiconductor switches of the inverter.

According to another aspect, the present invention creates a method for driving an inverter, having the steps of amplifying a switching signal for each of the semiconductor switches of the inverter for generating a plurality of first switching control signals, each of which drives a semiconductor switch in a switching mode; measuring the current intensity of a current flowing through each of the semiconductor switches; generating a plurality of second switching control signals, each of which drives a semiconductor switch in a linear mode as a function of the measured current intensity of the current flowing through the semiconductor switches; and selecting the first switching control signal or the second switching control signal for driving a control terminal of each of the semiconductor switches as a function of at least one mode selection signal for each of the semiconductor switches.

One idea of the present invention is to design a control device for semiconductor switches of an inverter in an electrically driven vehicle, which control device is able to implement an emergency discharge without requiring additional components. The emergency discharge is carried out via semiconductor switches which are already present in the inverter. The necessity of providing dedicated emergency discharge circuits is thus eliminated, which may entail significant savings in costs and installation space.

One advantage of the present invention is that an inverter which is designed having a control device according to the present invention and which comprises a plurality of bridge arms, each having two semiconductor switches, may be driven in such a way that the at least one mode selection signal specifies an emergency discharge mode of the inverter. In the emergency discharge mode, low-side switches of the inverter, that is, the semiconductor switches on one bridge side of each bridge arm, are able to be driven using the first switching control signal, and high-side switches of the inverter, that is, the semiconductor switches on the respective other bridge side of each bridge arm, are able to be driven using the second switching control signal. A coupling of the input terminals of the inverter with corresponding output terminals of the inverter is thus provided via the semiconductor switches driven in linear mode, which are then operated as current regulators. This provides the advantage of making it possible to discharge an intermediate-circuit capacitor connected to the input terminals of the inverter rapidly and reliably in linear mode via the semiconductor switches.

It is particularly advantageous that, on the one hand, no additional circuit components for discharging the intermediate-circuit capacitor have to be integrated, which saves space and manufacturing costs. On the other hand, the semiconductor switches are in any case thermally very well connected to the surrounding area, so that a discharge of the intermediate-circuit capacitor via the inverter does not cause overheating of the drive system.

According to one specific embodiment, the control device may furthermore comprise a current monitoring means which is coupled with the current sensor output of the semiconductor switch and the switching signal amplification means and which is designed to drive the switching signal amplification means for generating a first switching control signal which switches off the semiconductor switch if the current flowing through the semiconductor switch exceeds a predetermined threshold current value. The current monitoring means advantageously provides protection from short circuits when driving the semiconductor switches in switching mode.

According to an additional specific embodiment, the control device may be designed for driving an IGBT switch. This provides the advantage of making it possible for the current regulation means to be coupled with the collector terminal of the IGBT switch and supplied with operating voltage from the collector terminal. No additional components are thus required for driving the inverter.

BRIEF DESCRIPTION OF THE DRAWINGS

Additional features and advantages of specific embodiments of the present invention result from the following description with reference to the included drawings.

The following are shown.

DETAILED DESCRIPTION

Figure 1:
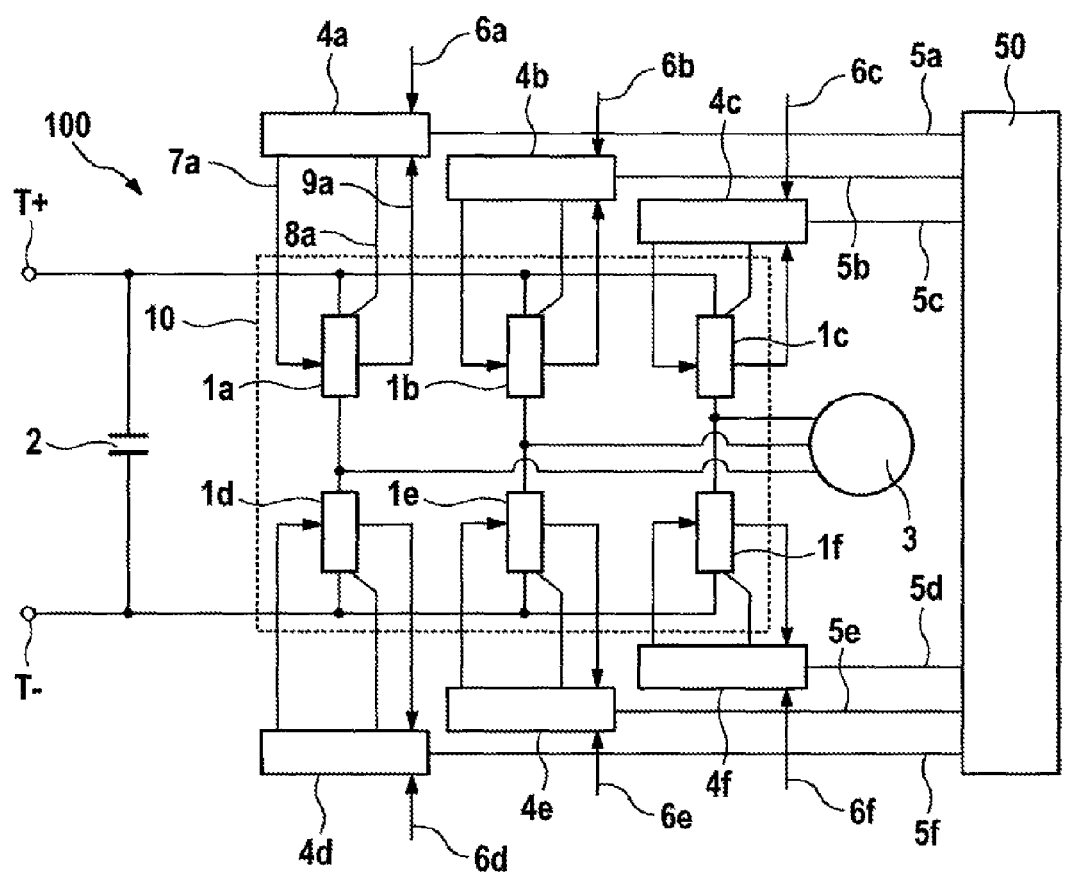
FIG. 1 shows a schematic representation of an electric drive system of a vehicle according to one specific embodiment of the present invention.

FIG. 1 shows a schematic representation of an electric drive system 100 of a vehicle. The electric drive system 100 comprises two input terminals T+ and T− which, for example, may be supplied with high voltage by an energy storage means such as a high-voltage battery or a traction battery of the vehicle. The input terminals T+ and T− are connected to a DC voltage intermediate circuit which has an intermediate-circuit capacitor 2. The intermediate-circuit capacitor 2 is connected via output terminals to input terminals of an inverter 10, for example, a pulse-width-modulation inverter 10. The voltage-source inverter depicted in FIG. 1 having the intermediate-circuit capacitor 2 and the inverter 10 is depicted as a three-phase converter by way of example; that is, the inverter 10 comprises three bridge arms, each having two semiconductor switches. The first bridge arm comprises, for example, the semiconductor switches 1a and 1d, the second bridge arm, for example, comprises the semiconductor switches 1b and 1e, and the third bridge arm, for example, comprises the semiconductor switches 1c and 1f. The semiconductor switches 1a, 1b, 1c of one bridge side are designated as high-side switches, and the semiconductor switches 1d, 1e, 1f of the other bridge side are designated as low-side switches. It should be clear that any other number of bridge arms or phases of the voltage-source inverter is likewise possible and that the designation of the semiconductor switches 1a to 1f as high-side and low-side switches is chosen only by way of example.

The semiconductor switches 1a to 1f depicted in FIG. 1 may, for example, have field-effect transistors (FETs). In one possible specific embodiment, the semiconductor switches are respectively IGBTs (insulated-gate bipolar transistors); however, it is also possible to provide other semiconductor switches in a corresponding form, for example, in the form of JFETs (junction field-effect transistors) or MOSFETs (metal-oxide semiconductor field-effect transistors). If the semiconductor switches 1a to 1f have IGBT switches, it may be provided to connect a diode, which is not depicted in FIG. 1 for reasons of clarity, inversely parallel to each of the IGBT switches.

The electric drive system 100 furthermore has a control 50 which is designed to generate switching signals 5a to 5f which encode switching driving of the semiconductor switches 1a to 1f. The switching signals 5a to 5f may, for example, have a logically low state if the semiconductor switches 1a to 1f are to be open, and a logically high state if the semiconductor switches 1a to 1f are to be closed. The control 50 supplies the switching signals 5a to 5f to corresponding control devices 4a to 4f, which are each responsible for driving one of the semiconductor switches 1a to 1f. The coupling of the control device 4a with the associated semiconductor switch 1a is explained below, each of the remaining control devices 4b to 4f being able to be coupled correspondingly.

The control device 4a has a control output via which a driving signal 7a may be provided to a control terminal of the semiconductor switch 1a in order to control the operation of the semiconductor switch 1a. The control device 4a is able to detect a current intensity of a current flowing through the semiconductor switch 1a via a current measurement signal 9a. In addition, the control device 4a may be supplied with voltage provided by a line terminal of the semiconductor switch 1a via a supply line 8a. If the semiconductor switch 1a has an IGBT switch, the supply line 8a may be coupled with a collector terminal of the IGBT switch.

Figure 2:
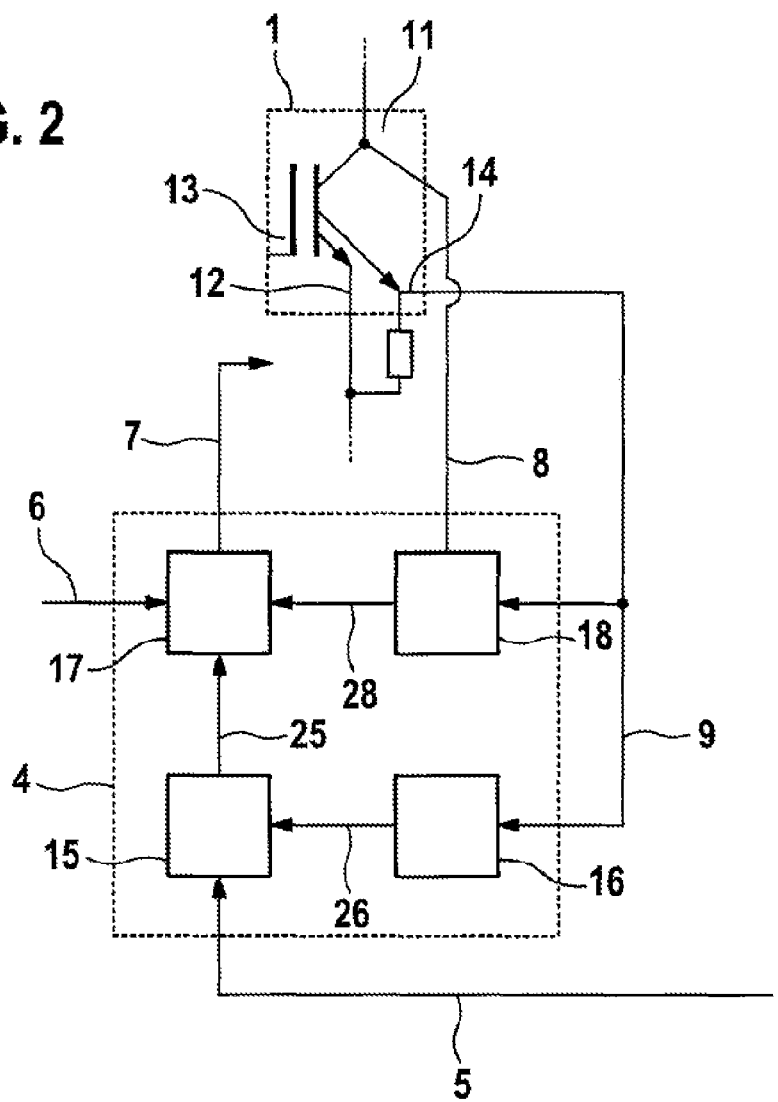
FIG. 2 shows a schematic representation of a control device for a semiconductor switch according to an additional specific embodiment of the present invention.

FIG. 2 shows a schematic representation of a control device 4 for a semiconductor switch 1. FIG. 2 shows in particular an exemplary specific embodiment of the control devices 4a to 4f and the associated semiconductor switches 1a to 1f in greater detail. The reference numbers used in FIG. 2 may each be provided with letters from a to f in order to identify the respective components of the electric drive system 100 shown in FIG. 1.

The control device 4 is used to drive a semiconductor switch 1, in particular a semiconductor switch 1 of an inverter. FIG. 2 shows the semiconductor switch 1 by way of example as an IGBT switch which has a collector terminal 11, an emitter terminal 12, a gate or control terminal 13, and a current sensor output 14. A current measurement signal 9 may be discharged via the current sensor output 14 which specifies the current intensity of a current flowing instantaneously through the IGBT switch 1. The IGBT switch 1 may be driven in various operating modes via the control terminal 13 by applying a corresponding driving signal 7 having a specific voltage level. In a switching mode, the IGBT switch 1 may be operated only in a cutoff or saturation region; that is, the IGBT switch 1 is either completely blocking or completely conducting. However, in a linear or active mode, the IGBT switch 1 may be operated in an amplification region; that is, the current intensity of the current flowing through the IGBT switch 1 scales proportionally or essentially proportionally to the voltage present at the control terminal.

The control device 4 has a switching signal amplification means 15 which is designed to amplify a switching signal 5 and to generate a first switching control signal 25. The switching signal 5 may, for example, be generated via a control 50 of the inverter 100. The switching control signal 25 is used to drive the semiconductor switch 1 in a switching mode.

The control device 4 furthermore has a current regulation means 18 which is coupled with the current sensor output 14 of the semiconductor switch 1 and which is designed to generate a second switching control signal 28 which drives the semiconductor switch 1 in a linear mode. For this purpose, the current regulation means 18 may control the second switching control signal 28 according to the current intensity of the current flowing through the semiconductor switch 1. For this purpose, the current regulation means 18 may advantageously use the current measurement signal 9 which is already used by the current monitoring means 16 explained below. The current regulation means 18 may, for example, be coupled with the collector terminal 11 of the IGBT switch 1 and supplied with operating voltage from the collector terminal 11. This enables the current regulation means 18 to function independently of a voltage supply of the control 5 even in the event of a failure of the control 5.

The control device 4 furthermore has a selection means 17 which is coupled with the switching signal amplification means 15 and the current regulation means 18. The selection means 17 is used to select the first switching control signal 25 or the second switching control signal 28 for outputting a driving signal 7 for the control terminal 13 of the semiconductor switch 1. The selection may take place as a function of at least one mode selection signal 6. The mode selection signal or signals 6 may, for example, be generated by various components of the electric drive system 100, which may indicate a fault and thus the activation of an emergency operation mode of the inverter 10. For example, the mode selection signal 6 may include a control signal of the control, a supply voltage signal of the high-voltage battery, or other sensor signals.

The control device 4 may have a current monitoring means 16 which is coupled to the current sensor output 14 of the semiconductor switch 1 and the switching signal amplification means 15. The current monitoring means 16 may implement short-circuit current monitoring; that is, the current monitoring means 16 may detect, with the aid of the current measurement signal 9, whether the current intensity of the current flowing through the semiconductor switch 1 exceeds a predetermined threshold current value. If such a short-circuit current is detected, the current monitoring means 16 may drive the switching signal amplification means 15 for generating a first switching control signal 25 which switches off the semiconductor switch 1. It is thus possible to switch off the semiconductor switch 1 before excessively high currents are able to damage the power electronics.

An IGBT switch 1 may be driven either in a linear mode or a switching mode using the control device 4. This enables in particular the setting of an emergency discharge mode in an inverter which is driven in such a way, thus allowing a rapid discharge of an intermediate-circuit capacitor supplying the inverter in an advantageous manner. It is particularly advantageous that the components of the inverter which are already available may be used for discharging without having to integrate additional circuits or discharging elements such as switchable resistors or the like.

The linear mode may, for example, be achieved by the driving signal 7 for the control terminal 13 of the semiconductor switch 1 having a voltage value which lies between the voltage value for switching on and the voltage value for switching off the semiconductor switch 1. Alternatively, the linear mode may, for example, be achieved by the driving signal 7 for the control terminal 13 of the semiconductor switch 1 being raised for a predefined brief period to a voltage value for switching on, and then being lowered again to the voltage value for switching off the semiconductor switch 1. The period may be selected in such a way that the semiconductor switch 1 is switched off again before it has reached full conductivity.

Figure 3:
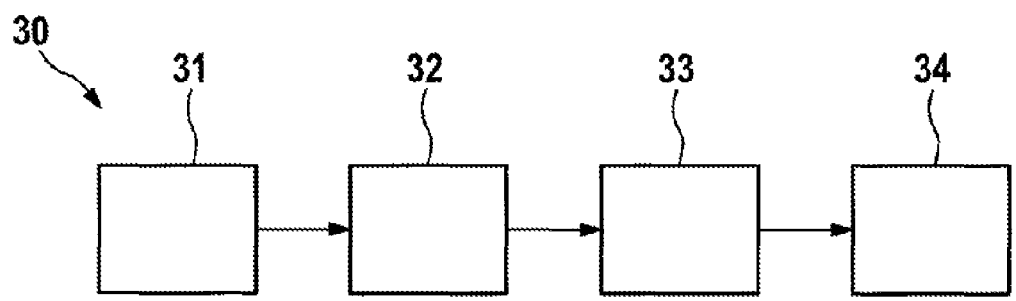
FIG. 3 shows a schematic representation of a method for driving an inverter according to an additional specific embodiment of the present invention.

FIG. 3 shows a schematic representation of a method 30 for driving an inverter, in particular an inverter 10 in the electric drive system 100 of an electrically driven vehicle depicted in FIG. 1. The method 30 comprises, in a first step, amplification of a switching signal for each of the semiconductor switches of the inverter for generating a plurality of first switching control signals, each of which drives a semiconductor switch in a switching mode. In a second step, measurement of the current intensity of a current flowing through each of the semiconductor switches takes place. For example, the current intensity of the current flowing through a semiconductor switch may be ascertained by detecting an output signal of a current measurement output of the semiconductor switch.

In a third step 33, generation of a plurality of second switching control signals, each of which drives a semiconductor switch in a linear mode, takes place as a function of the measured current intensity of the current flowing through the semiconductor switches. The linear mode of the semiconductor switch may comprise operating the semiconductor switch in an active amplification region; that is, the semiconductor switch may be operated in a current regulator mode.

In a fourth step 34, selection of the first switching control signal or the second switching control signal takes place for driving a control terminal of each of the semiconductor switches as a function of at least one mode selection signal for each of the semiconductor switches. The selection may be made in such a way that the interaction of the driving of all semiconductor switches of the inverter achieves a specific operating mode. For example, a normal operating mode of the inverter may be activated by operating all semiconductor switches in switching mode, that is, by selecting the respective first switching control signal for all semiconductor switches. The normal operating mode may, for example, comprise conventional driving of the inverter if no fault exists.

Similarly, one of several emergency operating states may be activated after the occurrence of a fault, for example, in the event of a failure of the voltage supply of the control, a vehicle accident, or other situations jeopardizing the operational safety of the electric drive system. In an "active short circuit" mode, for example, each of the semiconductor switches may be operated in switching mode, so that all semiconductor switches of a bridge side of the bridge arms, for example, the high-side switches, are put into a closed state, and all semiconductor switches of the other bridge side of the bridge arms, for example, the low-side switches, are put into an open state. It is to be understood that the driving of the high-side and low-side switches may also respectively take place in reverse.

The electric machine may thus be safely and reliably short-circuited via the closed semiconductor switches.

Alternatively, in the event of a fault, a rapid discharge of the intermediate-circuit capacitor is possible via the semiconductor switches of the inverter. For this purpose, all semiconductor switches of one bridge side of the bridge arms, for example, the high-side switches, may be put into an open state. The respective other semiconductor switches, for example, the low-side switches, may be driven in a linear or active mode instead of in a switching mode, so that these semiconductor switches function as current regulators. It is to be understood that the driving of the high-side and low-side switches may also respectively take place in reverse.

It is thus possible to discharge the intermediate-circuit capacitor via the semiconductor switches in linear mode. The semiconductor switches may be connected thermally to a cooling means or the ambient air of the electric drive system, so that heat developing during the discharge is able to be dissipated rapidly and safely.

The invention claimed is:

1. A control device for driving a semiconductor switch of an inverter, the control device comprising:
  a switching signal amplifier which is designed to amplify a switching signal generated by a control of the inverter and to generate a first switching control signal which drives the semiconductor switch in a switching mode;
  a current regulator which is coupled with a current sensor output of the semiconductor switch and which is designed to generate a second switching control signal which drives the semiconductor switch in a linear mode; and
  a selector which is coupled with the switching signal amplifier and the current regulator and which is designed to output either the first switching control signal or the second switching control signal as a function of at least one mode selection signal for driving a control terminal of the semiconductor switch,
  wherein the linear mode is achieved by the control terminal of the semiconductor switch being driven with an intermediate voltage value which lies between a first voltage value for switching on and a second voltage value for switching off the semiconductor switch, or wherein the linear mode is achieved by the control terminal of the semiconductor switch being raised for a predefined period to the first voltage value for switching on, and then being lowered again to the second voltage value for switching off the semiconductor switch, before the semiconductor switch has reached full conductivity.

2. The control device as claimed in claim 1, further comprising:
  a current monitor which is coupled with the current sensor output of the semiconductor switch and the switching signal amplifier and which is designed to drive the switching signal amplifier for generating the first switching control signal which switches off the semiconductor switch if a current flowing through the semiconductor switch exceeds a predetermined threshold current value.

3. The control device as claimed in claim 2, wherein the current monitor is designed to drive the switching signal amplifier for generating the first switching control signal which switches off the semiconductor switch if the semiconductor switch is driven in the linear mode.

4. The control device as claimed in claim 1, wherein the semiconductor switch is an IGBT switch.

5. The control device as claimed in claim 4, wherein the current regulator is coupled with a collector terminal of the IGBT switch and is supplied with operating voltage from the collector terminal.

6. A drive system for an n-phase electric machine, where n ≥1, the drive system comprising:
  an intermediate-circuit capacitor which is connected to two input voltage terminals;
  an inverter having a plurality of semiconductor switches, the inverter is coupled with the intermediate-circuit capacitor and supplied with electric energy from the intermediate-circuit capacitor, and the inverter is configured to generate an n-phase supply voltage for the n-phase electric machine;
  a control configured to generate switching signals for the plurality of semiconductor switches of the inverter; and
  a plurality of control devices coupled to the control, each control device of the plurality of control devices is configured to generate a first switching control signal and a second switching control signal for one of the plurality of semiconductor switches of the inverter, wherein the each control device of the plurality of control devices includes
    a switching signal amplifier configured to amplify one of the switching signals generated by the control to generate the first switching control signal which drives the one of the plurality of semiconductor switches in a switching mode;
    a current regulator which is coupled with a current sensor output of the one of the plurality of semiconductor switches and configured to generate the second switching control signal which drives the one of the plurality of semiconductor switches in a linear mode; and
    a selector which is coupled with the switching signal amplifier and the current regulator and is configured to output either the first switching control signal or the second switching control signal as a function of at least one mode selection signal for driving a control terminal of the one of the plurality of semiconductor switches,
    wherein the linear mode is achieved by the control terminal of the one of the plurality of semiconductor switches being driven with an intermediate voltage value which lies between a first voltage value for switching on and a second voltage value for switching off the one of the plurality of semiconductor switches, or wherein the linear mode is achieved by the control terminal of the one of the plurality of semiconductor switches being raised for a predefined period to the first voltage value for switching on, and then being lowered again to the second voltage value for switching off the one of the plurality of semiconductor switches, before the one of the plurality of semiconductor switches has reached full conductivity.

7. The drive system as claimed in claim 6, wherein the plurality of semiconductor switches are IGBT switches.

8. A method for driving an inverter, the method comprising:
  amplifying a switching signal for each semiconductor switch of a plurality of semiconductor switches of the inverter to generate a plurality of first switching control signals, wherein one of the plurality of first switching controls signals is configured to drive a first semiconductor switch of the plurality of semiconductor switches in a switching mode;

measuring an intensity of a current flowing through the each semiconductor switch of the plurality of semiconductor switches;

generating a plurality of second switching control signals as a function of measuring the intensity of the current flowing through the semiconductor switches, wherein one of the plurality of second switching control signals is configured to drive the first semiconductor switch of the plurality of semiconductor switches in a linear mode; and selecting the one of the plurality of first switching control signals or the one of the plurality of second switching control signals for driving a control terminal of the first semiconductor switch as a function of at least one mode selection signal for the first semiconductor switch, wherein the linear mode is achieved by the control terminal of the first semiconductor switch being driven with an intermediate voltage value which lies between a first voltage value for switching on and a second voltage value for switching off the first semiconductor switch, or wherein the linear mode is achieved by the control terminal of the first semiconductor switch being raised for a predefined period to the first voltage value for switching on, and then being lowered again to the second voltage value for switching off the first semiconductor switch, before the first semiconductor switch has reached full conductivity.

9. The method as claimed in claim 8, wherein the inverter comprises a plurality of bridge arms, each bridge arm of the plurality of bridge arms having two semiconductor switches, wherein the at least one mode selection signal specifies an emergency discharge mode of the inverter, and wherein the first switching control signal is selected for driving the respective control terminals for one respective semiconductor switch of the each bridge arm, and the second switching control signal is selected for driving the respective control terminals for the other respective semiconductor switch of the each bridge arm.

* * * * *